(12) United States Patent
Kanba (10) Patent No.: US 6,456,113 B2
(45) Date of Patent: Sep. 24, 2002

(54) SCAN FLIP-FLOP CIRCUIT HAVING SCAN LOGIC OUTPUT TERMINAL DEDICATED TO SCAN TEST (75) Inventor: Kohji Kanba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/839,297

(22) Filed: Apr. 23, 2001

(30) Foreign Application Priority Data

Apr. 24, 2000 (JP) ........................................ 2000-122558

(51) Int. Cl.[7] .............................................. H03K 3/037
(52) U.S. Cl. ............................. 326/93; 326/96; 327/212
(58) Field of Search .............................. 326/93–98, 46; 327/202, 203, 208–213

(56) References Cited

U.S. PATENT DOCUMENTS 6,023,179 A * 2/2000 Klass ........................... 326/98
6,181,179 B1 * 1/2001 Kanba ......................... 327/202

FOREIGN PATENT DOCUMENTS

| JP | 59-91780 | 5/1984 |
|---|---|---|
| JP | 61-262827 | 11/1986 |
| JP | 63-222275 | 9/1988 |
| JP | 1-272229 | 10/1989 |
| JP | 10-62495 | 3/1998 |

* cited by examiner

Primary Examiner—Don Phu Le
(74) Attorney, Agent, or Firm—McGinn & Gibb, PLLC (57) ABSTRACT A slave latch circuit has a gate for being supplied with a signal which is an inversion of a signal outputted from a first output terminal and a control'signal, generating a signal based on the supplied signals, and outputting the generated signal from a second output terminal. The gate controls the output signal outputted from the second output terminal. The gate may comprise a NAND gate for being supplied with a ground potential as the control signal in a normal mode of operation for thereby fixing the output signal outputted from the second output terminal to a power supply potential. Alternatively, the gate may comprise a NOR gate for being supplied with the power supply potential as the control signal in the normal mode of operation for thereby fixing the output signal outputted from the second output terminal to a ground potential.

16 Claims, 6 Drawing Sheets

SCAN FLIP-FLOP CIRCUIT HAVING SCAN LOGIC OUTPUT TERMINAL DEDICATED TO SCAN TEST

BACKGROUND OF THE INVENTION

1. Field of the Invention

The present invention relates to a scan flip-flop circuit for use in a scan test for detecting a fault in a semiconductor integrated circuit.

2. Description of the Related Art

Figure 1:
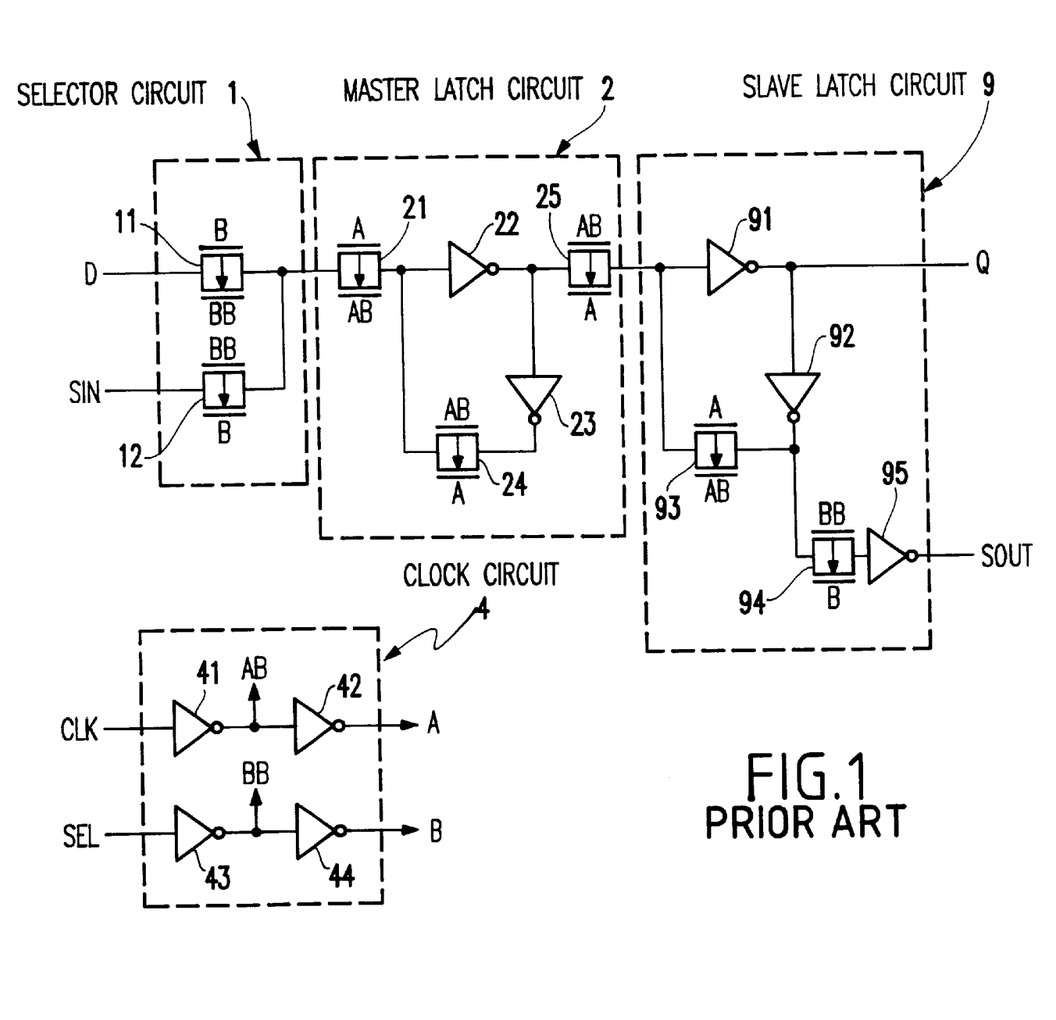
FIG. 1 is a block diagram of a conventional scan flip-flop circuit.

Heretofore, scan tests for detecting faults in semiconductor integrated circuits such as LSI circuits or the like employ a scan flip-flop circuit as shown in FIG. 1 of the accompanying drawings, for example.

As shown in FIG. 1, the conventional scan flip-flop circuit comprises selector circuit 1 having a normal logic input terminal and a scan logic input terminal, master latch circuit 2, slave latch circuit 9 having a logic output terminal and a scan logic output terminal, and clock circuit 4.

The scan logic output terminal is an output terminal dedicated to scan tests, and does not operate in a normal mode of operation, but operates only in a scan test.

Selector circuit 1 comprises transfer gates 11, 12.

Transfer gate 11 selectively passes and blocks normal logic input signal D inputted from the normal logic input terminal.

Transfer gate 12 selectively passes and blocks scan logic input signal SIN inputted from the scan logic input terminal.

Master latch circuit 2 comprises transfer gates 21, 24, 25 and inverters 22, 23.

Transfer gate 21 selectively passes and blocks a signal outputted from selector circuit 1.

Inverter 22 inverts a signal that has passed through transfer gate 21, and outputs the inverted signal.

Transfer gate 25 selectively passes and blocks a signal outputted from inverter 22, and outputs the passed signal to slave latch circuit 9 in a subsequent stage.

Inverter 23 inverts a signal outputted from inverter 22, and outputs the inverted signal.

Transfer gate 24 selectively passes and blocks a signal inputted from inverter 23 to inverter 22.

Slave latch circuit 9 comprises inverters 91, 92, 95 and transfer gates 93, 94.

Inverter 91 inverts a signal outputted from master latch circuit 2, and outputs the inverted signal as logic output signal Q from the logic output terminal.

Inverter 92 inverts a signal outputted from inverter 91, and outputs the inverted signal.

Transfer gate 93 selectively passes and blocks a signal inputted from inverter 92 to inverter 91.

Transfer gate 94 selectively passes and blocks a signal outputted from inverter 92.

Inverter 95 inverts a signal that has passed through transfer gate 94, and outputs the inverted signal as scan logic output signal SOUT from the scan logic output terminal.

Clock circuit 4 comprises inverters 41, 42, 43, 44.

Inverter 41 inverts clock signal CLK and outputs the inverted clock signal as clock signal AB.

Inverter 42 inverts a signal outputted from inverter 41 and outputs the inverted signal as clock signal A.

Inverter 43 inverts control signal SEL and outputs the inverted clock signal As control signal BB.

Inverter 44 inverts a signal outputted from inverter 43 and outputs the inverted signal as control signal B.

Clock signals AB, A and control signals BB, B thus generated control the transfer gates in selector circuit 1, master latch circuit 2, and slave latch circuit 9.

Figure 2:
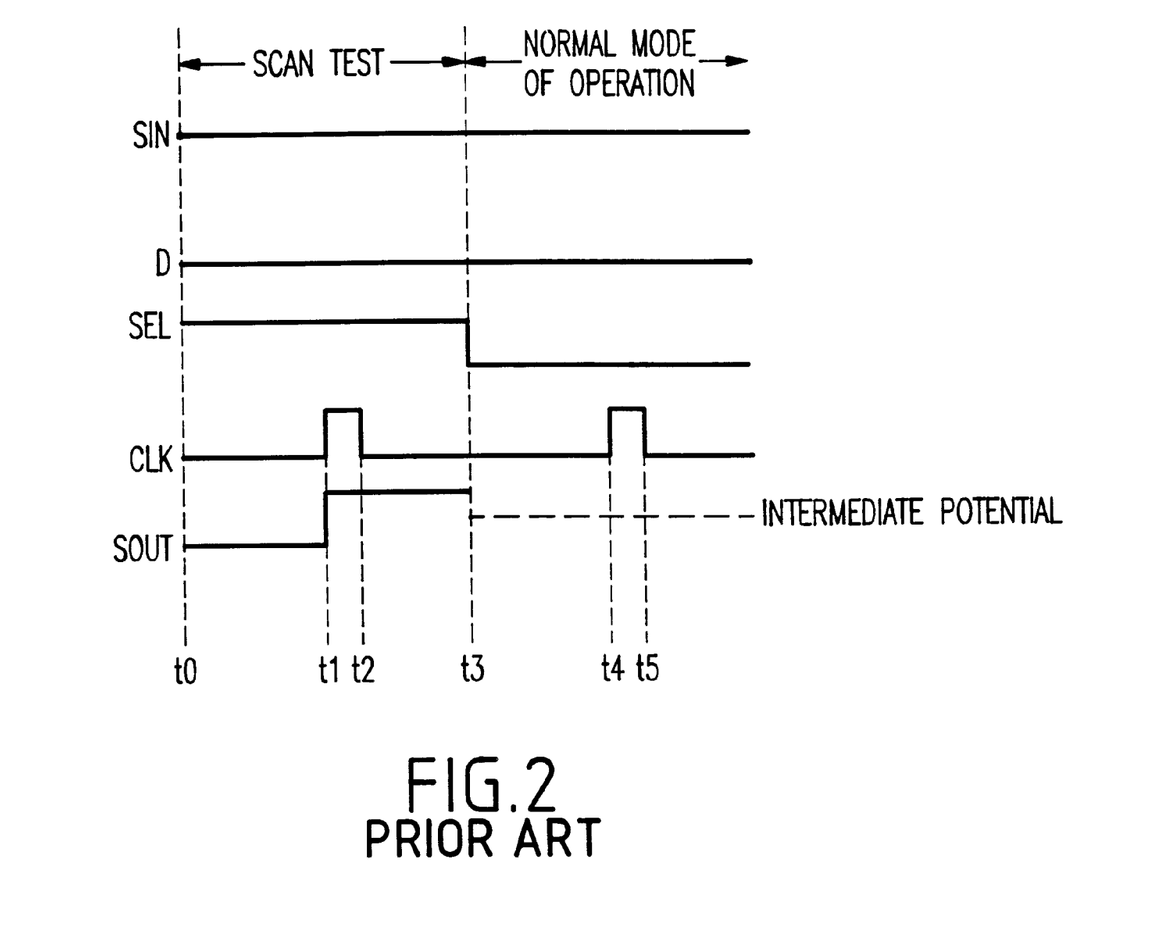
FIG. 2 is a timing chart illustrative of the manner in which the conventional scan flip-flop circuit shown in FIG. 1 operates.

Operation of the scan flip-flop circuit constructed as described above will be described below with reference to FIG. 2 of the accompanying drawings.

First, a normal mode of operation of the scan flip-flop circuit will be described below.

When control signal SEL applied to clock circuit 4 goes low at time t=t3, control signal BB goes high and control signal B goes low. Therefore, in selector circuit 1, transfer gate 11 is rendered conductive, outputting normal logic input signal D.

As clock signal CLK applied to clock circuit 4 is "Low", clock signal AB is "High" and clock signal A is "Low". Therefore, transfer gate 21 in master latch circuit 2 is rendered conductive. Consequently, normal logic input signal D outputted from selector circuit 1 is supplied to master latch circuit 2 and inverted and outputted by inverter 22.

When clock signal CLK goes high at time t=t4, clock signal AB goes low and clock signal A goes high. Therefore, transfer gate 21 is rendered nonconductive, and transfer gates 24, 25 are rendered conductive. The signal outputted from inverter 22 is latched and outputted to slave latch circuit 9.

In slave latch circuit 9, the signal supplied from master latch circuit 2 is inverted by inverter 91, and the inverted signal is outputted as logic output signal Q from the logic output terminal.

When clock signal CLK goes low again at time t=t5, clock signal AB goes high and-clock signal A goes low. Consequently, transfer gate 93 is rendered conductive. Thus, logic output signal Q is latched and outputted.

In the normal mode of operation (when control signal SEL is "Low"), since control signal BB is "High" and control signal B is "Low", transfer gate 94 is nonconductive. Therefore, the scan logic output terminal does not operate.

A scan test mode of operation of the scan flip-flop circuit will be described below.

In a scan test, when control signal SEL applied to clock circuit 4 goes high at time t=t0, control signal BB goes low and control signal B goes high. In selector circuit 1, transfer gate 12 is rendered conductive, outputting scan logic input signal SIN.

As clock signal CLK applied to clock circuit 4 is "Low", clock signal AB is "High" and clock signal A is "Low". Therefore, transfer gate 21 in master latch circuit 2 is rendered conductive. Consequently, scan logic input signal SIN outputted from selector circuit 1 is supplied to master latch circuit 2 and inverted and outputted by inverter 22.

When clock signal CLK goes high at time t=t1, clock signal AB goes low and clock signal A goes high. Therefore, transfer gate 21 is rendered nonconductive, and transfer gates 24, 25 are rendered conductive. The signal outputted from inverter 22 is latched and outputted to slave latch circuit 9.

In slave latch circuit 9, the signal supplied from master latch circuit 2 is inverted by inverter 91, and the inverted signal is outputted as logic output signal Q from the logic output terminal.

When clock signal CLK goes low again at time t=t2, clock signal AB goes high and clock signal A goes low.

Consequently, transfer gate 93 is rendered conductive. Thus, logic output signal Q is latched and outputted.

In the scan test (when control signal SEL is "High"), since control signal BB is "Low" and control signal B is "High", transfer gate 94 is rendered conductive. Therefore, the signal outputted from inverter 92 is inverted by inverter 95, and the inverted signal is outputted as scan logic output signal SOUT from the scan logic output terminal.

The scan flip-flop circuit shown in FIG. 1 has its scan logic output terminal connected to the scan logic input terminal of a next scan flip-flop circuit. All the scan flip-flop circuits are connected in series by their scan logic output terminals and scan logic input terminals. In a scan test, all the scan flip-flop circuits shift signals through their scan logic output terminals and scan logic input terminals.

In general scan flip-flop circuits, the scan logic output terminal operates in synchronism with the logic output terminal though the scan logic output terminal is not used in the normal mode of operation. Accordingly, the scan logic output terminal consumes electric power in the normal mode of operation.

In the scan flip-flop circuit shown in FIG. 1, however, transfer gate 94 is controlled by control signal SEL to stop operation of the scan logic output terminal in the normal mode of operation. As a result, the power consumption by the scan logic output terminal is relatively low.

Actually, however, when transfer gate 94 connected to the scan logic output terminal is rendered nonconductive, it outputs an intermediate potential that is applied to inverter 95. As shown in FIG. 2, the intermediate potential is outputted as the scan logic output signal SOUT, and the scan logic output terminal consumes a large amount of electric power.

SUMMARY OF THE INVENTION

It is an object of the present invention to provide a scan flip-flop circuit which is capable of reducing power consumption by a scan logic output terminal in a normal mode of operation.

According to the present invention, a scan flip-flop circuit includes a slave latch circuit having a gate for being supplied with a signal which is an inversion of a signal outputted from a first output terminal and a control signal, generating a signal based on the supplied signals, and outputting the generated signal from a second output terminal. The gate controls the output signal outputted from the second output terminal.

The gate may comprise a NAND gate, for example, for being supplied with a ground potential, i.e., a "Low" level signal, as the control signal in a normal mode of operation for thereby fixing the output signal outputted from the second output terminal to a power supply potential, i.e., a "High" level signal.

Alternatively, the gate may comprise a NOR gate, for example, for being supplied with the power supply potential, i.e., the "High" level signal, as the control signal in the normal mode of operation for thereby fixing the output signal outputted from the second output terminal to the ground potential, i.e., the "Low" level signal.

In the normal mode of operation, since the output signal outputted from the second output terminal, which serves as a scan logic output terminal, is fixed to the power supply potential or the ground potential, no operation whatsoever is performed by the scan logic output terminal. Consequently, the amount of electric power consumed by the scan logic output terminal can be reduced.

The above and other objects, features, and advantages of the present invention will become apparent from the following description with reference to the accompanying drawings which illustrate examples of the present invention.

DESCRIPTION OF THE PREFERRED EMBODIMENTS

1st Embodiment

Figure 3:
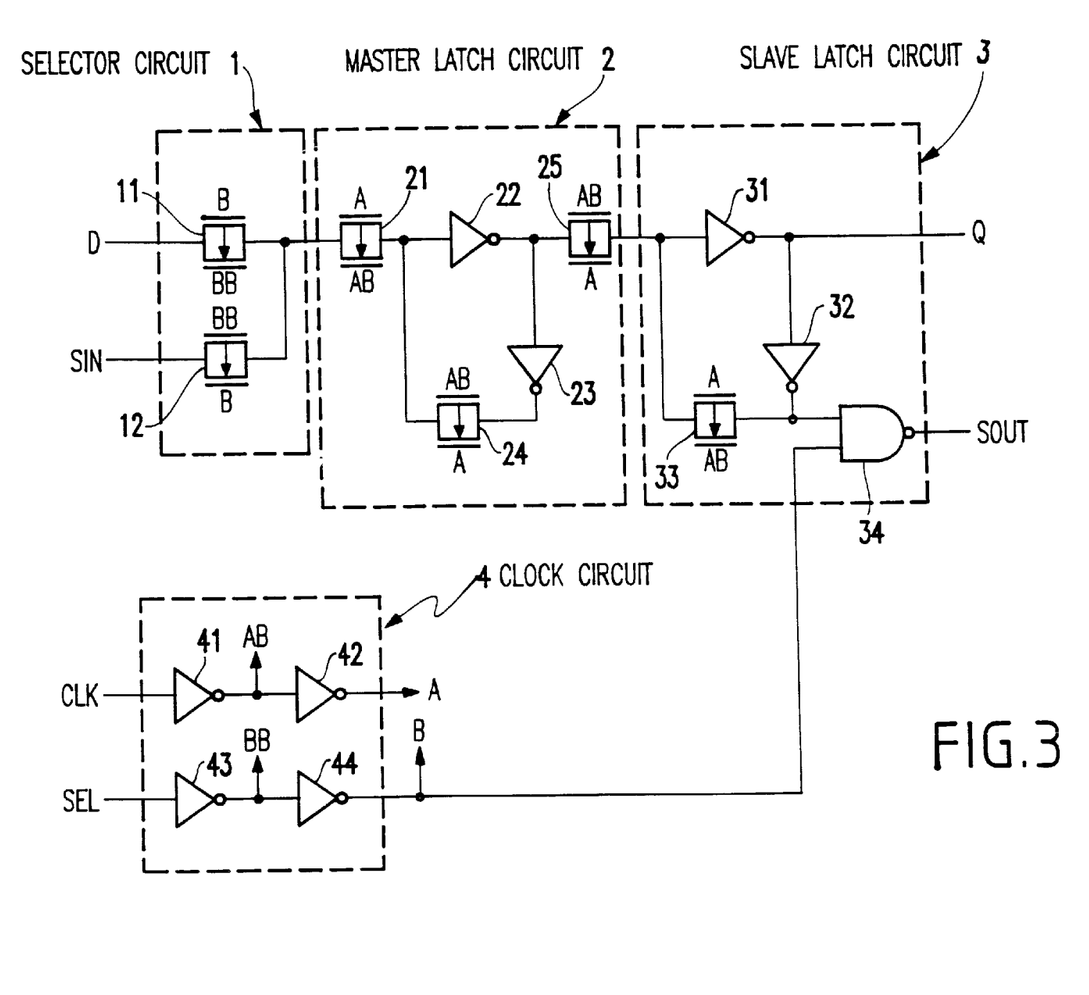
FIG. 3 is a block diagram of a scan flip-flop circuit according to a first embodiment of the present invention.

As shown in FIG. 3, a scan flip-flop circuit according to a first embodiment of the present invention comprises selector circuit 1 having a normal logic input terminal and a scan logic input terminal which serve as first and second input terminals, respectively, master latch circuit 2, slave latch circuit 3 having a logic output terminal and a scan logic output terminal which serve as first and second output terminals, respectively, and clock circuit 4.

The scan flip-flop circuit according to the first embodiment differs from the conventional scan flip-flop circuit shown in FIG. 1 in that it has slave latch circuit 3 in place of slave latch circuit 9 shown in FIG. 1. Other details of the scan flip-flop circuit according to the first embodiment are identical to those of the conventional scan flip-flop circuit shown in FIG. 1. Therefore, those parts of the scan flip-flop circuit according to the first embodiment which are identical to those of the conventional scan flip-flop circuit shown in FIG. 1 are denoted by identical reference characters, and will not be described in detail below.

Slave latch circuit 3 comprises inverters 31, 32, transfer gate 33, and NAND gate 34.

Inverter 31 inverts a signal outputted from master latch circuit 2, and outputs the inverted signal as logic output signal Q from the logic output terminal.

Inverter 32 inverts a signal outputted from inverter 31, and outputs the inverted signal.

Transfer gate 33 selectively passes and blocks a signal inputted from inverter 32 to inverter 31.

NAND gate 34 NANDs the signal outputted from inverter 32 and control signal B generated by clock circuit 4, and outputs the NANDed result as scan logic output signal SOUT from the scan logic output terminal.

Transfer gate 33 is rendered nonconductive when slave latch circuit 3 is supplied with the signal outputted from master latch circuit 2, and rendered conductive when slave latch circuit 3 latches the signal supplied from master latch circuit 2.

Figure 4:
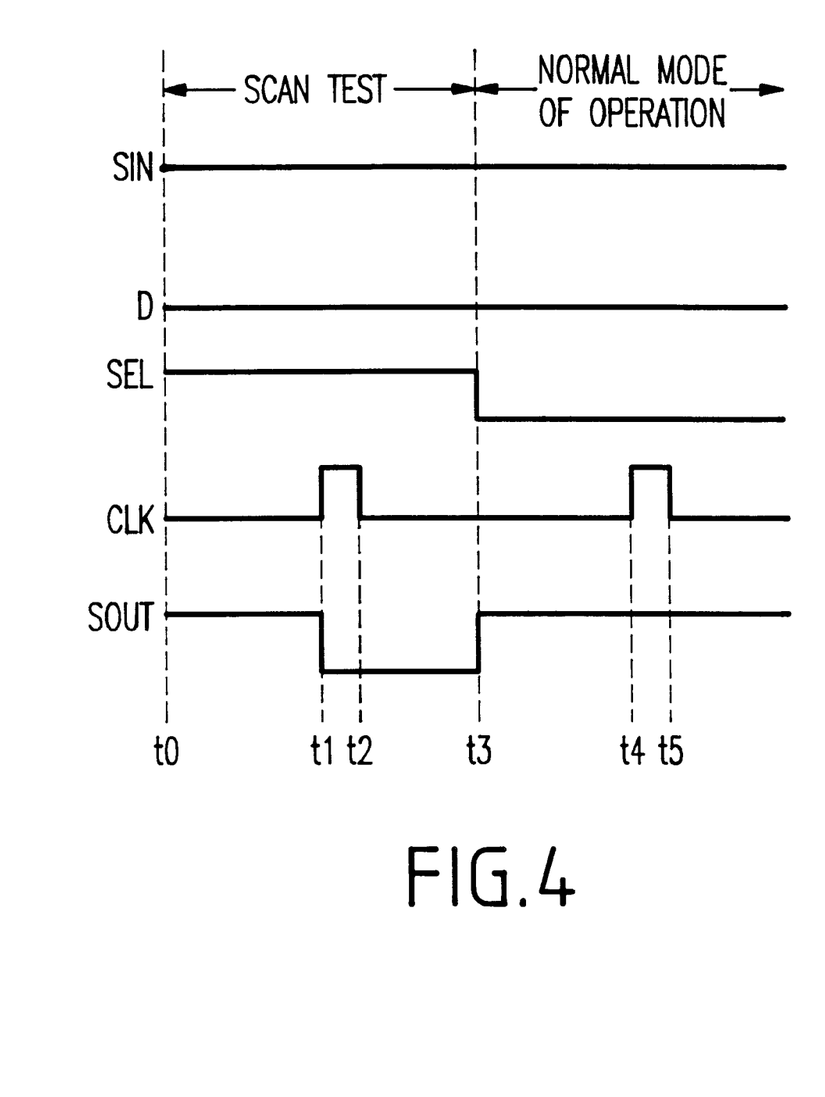
FIG. 4 is a timing chart illustrative of the manner in which the scan flip-flop circuit shown in FIG. 3 operates.

Operation of the scan flip-flop circuit constructed as described above will be described below with reference to FIG. 4.

First, a normal mode of operation of the scan flip-flop circuit will be described below.

When control signal SEL applied to clock circuit 4 goes low at time t=t3, control signal BB goes high and control signal B goes low. Therefore, in selector circuit 1, transfer gate 11 is rendered conductive, outputting normal logic input signal D.

As clock signal CLK applied to clock circuit 4 is "Low", clock signal AB is "High" and clock signal A is "Low". Therefore, transfer gate 21 in master latch circuit 2 is rendered conductive. Consequently, normal logic input signal D outputted from selector circuit 1 is supplied to master latch circuit 2 and inverted and outputted by inverter 22.

When clock signal CLK goes high at time t=t4, clock signal AB goes low and clock signal A goes high. Therefore, transfer gate 21 is rendered nonconductive, and transfer gates 24, 25 are rendered conductive. The signal outputted from inverter 22 is latched and outputted to slave latch circuit 3.

In slave latch circuit 3, the signal supplied from master latch circuit 2 is inverted by inverter 31, and the inverted signal is outputted as logic output signal Q from the logic output terminal.

When clock signal CLK goes low again at time t=t5, clock signal AB goes high and clock signal A goes low. Consequently, transfer gate 33 is rendered conductive. Thus, logic output signal Q is latched and outputted.

Since control signal B is "Low", the output signal from NAND gate 34 is fixed to a "High" level that is equal to a power supply potential irrespectively of whether the signal outputted from inverter 32 is either "Low" or "High".

A scan test mode of operation of the scan flip-flop circuit will be described below.

In a scan test, when control signal SEL applied to clock circuit 4 goes high at time t=t0, control signal BB goes low and control signal B goes high. In selector circuit 1, transfer gate 12 is rendered conductive, outputting scan logic input signal SIN.

As clock signal CLK applied to clock circuit 4 is "Low", clock signal AB is "High" and clock signal A is "Low". Therefore, transfer gate 21 in master latch circuit 2 is rendered conductive. Consequently, scan logic input signal SIN outputted from selector circuit 1 is supplied to master latch circuit 2 and inverted and outputted by inverter 22.

When clock signal CLK goes high at time t=t1, clock signal AB goes low and clock signal A goes high. Therefore, transfer gate 21 is rendered nonconductive, and transfer gates 24, 25 are rendered conductive. The signal outputted from inverter 22 is latched and outputted to slave latch circuit 3.

In slave latch circuit 3, the signal supplied from master latch circuit 2 is inverted by inverter 31, and the inverted signal is outputted as logic output signal Q from the logic output terminal.

When clock signal CLK goes low again at time t=t2, clock signal AB goes high and clock signal A goes low. Consequently, transfer gate 33 is rendered conductive. Thus, logic output signal Q is latched and outputted.

Since control signal B is "High", a signal outputted from NAND gate 34 by NANDing control signal B and the inverted signal outputted from inverter 32 is the same as logic output signal Q outputted from the logic output terminal. Therefore, the signal that is the same as logic output signal Q is outputted as scan logic output signal SOUT from the scan logic output terminal.

In the normal mode of operation, as described above, when control signal SEL goes low, the output signal from NAND gate 34 in slave latch circuit 3, i.e., the output signal from the scan logic output terminal, is fixed to a "High" level that is equal to a power supply potential.

Therefore, in the normal mode of operation, no leakage current flows to the scan logic output terminal, and hence no operation whatsoever is performed by the scan logic output terminal, so that the amount of electric power consumed by the scan logic output terminal can be reduced.

In the scan test, when control signal SEL goes high, scan logic input signal SIN is supplied to master latch circuit 2, and, at a positive-going edge of clock signal CLK, the signal supplied to master latch circuit 2 is latched and outputted to slave latch circuit 3. Subsequently, at a negative-going edge of clock signal CLK, the signal supplied to slave latch circuit 3 is latched and outputted as scan logic output signal SOUT from the scan logic output terminal.

In the scan test, therefore, scan logic input signal SIN can be transmitted from the scan logic input terminal to the scan logic output terminal in timed relation to the positive- and negative-going edges of clock signal CLK for thereby performing the scan test mode of operation.

2nd Embodiment

Figure 5:
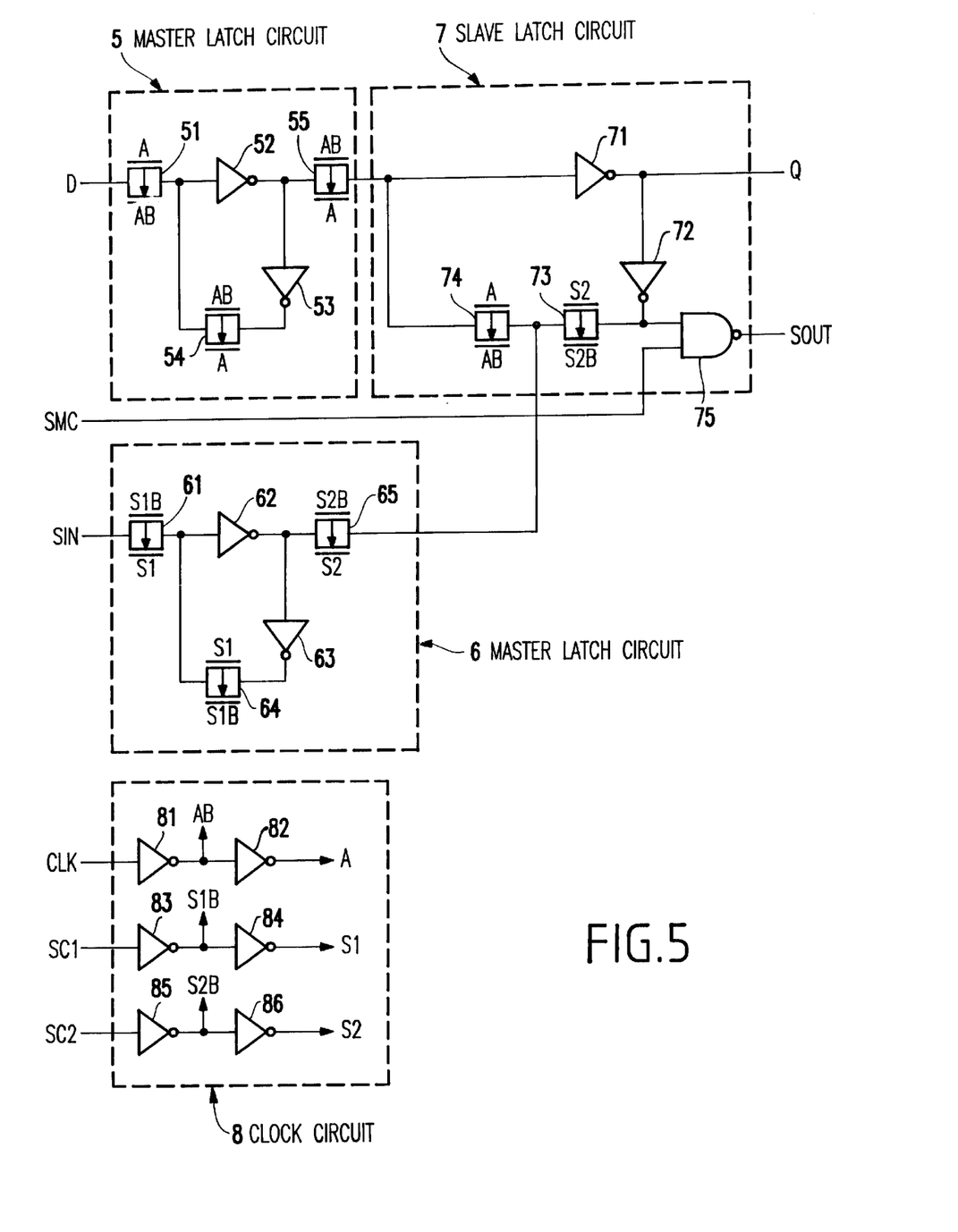
FIG. 5 is a block diagram of a scan flip-flop circuit according to a second embodiment of the present invention.

As shown in FIG. 5, a scan flip-flop circuit according to a second embodiment of the present invention comprises master latch circuit 5 having a normal logic input terminal, master latch circuit 6 having a scan logic input terminal, slave latch circuit 7 having a logic output terminal and a scan logic output terminal which serve as first and second output terminals, respectively, and clock circuit 8.

Master latch circuit 5 comprises transfer gates 51, 54, 55 and inverters 52, 53.

Transfer gate 51 selectively passes and blocks normal logic input signal D inputted from the normal logic input terminal.

Inverter 52 inverts a signal that has passed through transfer gate 51, and outputs the inverted signal.

Transfer gate 55 selectively passes and blocks a signal outputted from inverter 52, and outputs the passed signal to slave latch circuit 7 in a subsequent stage.

Inverter 53 inverts a signal outputted from inverter 52, and outputs the inverted signal.

Transfer gate 54 selectively passes and blocks a signal inputted from inverter 53 to inverter 52.

Master latch circuit 6 comprises transfer gates 61, 64, 65 and inverters 62, 63.

Transfer gate 61 selectively passes and blocks scan logic input signal SIN inputted from the scan logic input terminal.

Inverter 62 inverts a signal that has passed through transfer gate 61, and outputs the inverted signal.

Transfer gate 65 selectively passes and blocks a signal outputted from inverter 62, and outputs the passed signal to slave latch circuit 7 in a subsequent stage.

Inverter 63 inverts a signal outputted from inverter 62, and outputs the inverted signal.

Transfer gate 64 selectively passes and blocks a signal inputted from inverter 63 to inverter 62.

Slave latch circuit 7 comprises inverters 71, 72, transfer gates 73, 74, and NAND gate 75.

Inverter 71 inverts a signal outputted from master latch circuit 5, and outputs the inverted signal as logic output signal Q from the logic output terminal.

Inverter 72 inverts a signal outputted from inverter 71, and outputs the inverted signal.

Transfer gates 73, 74 selectively pass and block a signal inputted from inverter 72 to inverter 71.

NAND gate 75 NANDs the signal outputted from inverter 72 and control signal SMC, and outputs the NANDed result as scan logic output signal SOUT from the scan logic output terminal.

Master latch circuit 5 has an output terminal connected to an input terminal of inverter 71, and master latch circuit 6 has an output terminal connected to the junction between transfer gates 73, 74.

Transfer gate 73 is rendered conductive at all times in a normal mode of operation. Transfer gate 73 is rendered nonconductive when slave latch circuit 7 is supplied with the signal outputted from master latch circuit 6, and rendered conductive when slave latch circuit 7 latches the signal supplied from master latch circuit 6 in a scan test mode of operation.

Transfer gate 74 is rendered conductive at all times in a scan test mode of operation. Transfer gate 74 is rendered nonconductive when slave latch circuit 7 is supplied with the signal outputted from master latch circuit 5, and rendered conductive when slave latch circuit 7 latches the signal supplied from master latch circuit 5 in a normal mode of operation.

Clock circuit 8 comprises inverters 81, 82, 83, 84, 85, 86.

Inverter 81 inverts clock signal CLK and outputs the inverted clock signal as clock signal AB.

Inverter 82 inverts a signal outputted from inverter 81 and outputs the inverted signal as clock signal A.

Inverter 83 inverts clock signal SC1 and outputs the inverted clock signal as clock signal S1B.

Inverter 84 inverts a signal outputted from inverter 83 and outputs the inverted signal as clock signal S1.

Inverter 85 inverts clock signal SC2 and outputs the inverted clock signal as clock signal S2B.

Inverter 86 inverts a signal outputted from inverter 85 and outputs the inverted signal as clock signal S2.

Clock signals AB, A, S1B, S1, S2B, S2 thus generated control the transfer gates in master latch circuits 5, 6 and slave latch circuit 7.

Clock signal CLK is a clock signal for a normal mode of operation, and is kept at a "Low" level in a scan test. Clock signals SC1, SC2 are clock signals for a scan test, and is kept at a "Low" t level in a normal mode of operation.

Figure 6:
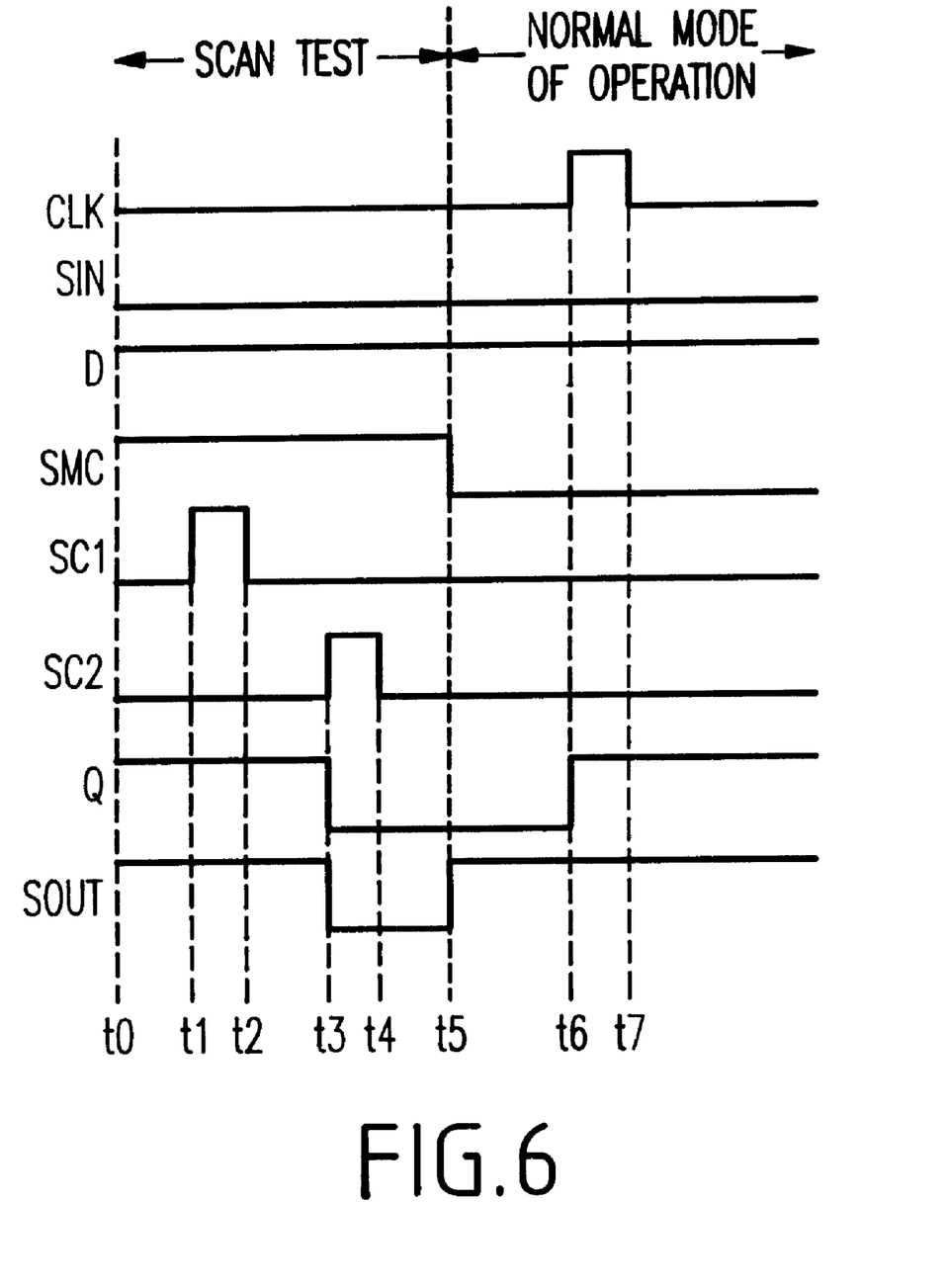
FIG. 6 is a timing chart illustrative of the manner in which the scan flip-flop circuit shown in FIG. 5 operates.

Operation of the scan flip-flop circuit constructed as described above will be described below with reference to FIG. 6.

First, a normal mode of operation of the scan flip-flop circuit will be described below. In the normal mode of operation, clock signals SC1, SC2 are kept at a "Low" level, and only clock signal CLK changes in level.

In the normal mode of operation, control signal SMC is "Low" at time t=t5.

At time t=t5, since control signal CLK is "Low", clock signal AB is "High" and clock signal A is "Low". Because transfer gate 51 in master latch circuit 5 is rendered conductive, master latch circuit 5 is supplied with normal logic input signal D from the normal logic input terminal, and the supplied signal is inverted and outputted by inverter 52.

When clock signal CLK goes high at time t=t6, clock signal AB goes low and clock signal A goes high. Therefore, transfer gate 51 is rendered nonconductive, and transfer gates 54, 55 are rendered conductive. The signal outputted from inverter 52 is latched and outputted to slave latch circuit 7.

In slave latch circuit 7, the signal supplied from master latch circuit 5 is inverted by inverter 71, and the inverted signal is outputted as logic output signal Q from the logic output terminal.

Inasmuch as clock signal SC2 is "Low", clock signal S2B is "High" and clock signal S2 is "Low". Therefore, transfer gate 73 is rendered conductive.

When clock signal CLK goes low again at time t=t7, clock signal AB goes high and clock signal A goes low. Consequently, transfer gate 74 is rendered conductive. Thus, logic output signal Q is latched and outputted.

Since control signal SMC is "Low", the output signal from NAND gate 75 is fixed to a "High" level that is equal to a power supply potential irrespectively of whether the signal outputted from inverter 72 is either "Low" or "High".

A scan test mode of operation of the scan flip-flop circuit will be described below. In a scan test, clock signal CLK is kept at a "Low" level, and only clock signals SC1, SC2 change in level.

In the scan test, control signal SMC is "High" at time t=t0, and both clock signals SC1, SC2 are "Low".

When clock signal SC1 goes high at time t=t1, clock signal S1B goes low and clock signal S1 goes high. Therefore, transfer gate 61 in master latch circuit 6 is rendered conductive. Consequently, scan logic input signal SIN is supplied from the scan logic input terminal to master latch circuit 6 and inverted and outputted by inverter 62.

At time t=t1, since clock signal SC2 is "Low", clock signal S2B is "High" and clock signal S2 is "Low". Thus, transfer gate 65 is nonconductive, preventing the signal outputted from inverter 62 from being supplied to slave latch circuit 7.

At time t=t2, clock signal SC2 remains "Low" and clock signal SC1 goes low. Since clock signal S1B goes high and clock signal S1 goes low, transfer gate 61 is rendered nonconductive and transfer gate 64 is rendered conductive. Accordingly, the signal outputted from inverter 62 is latched.

At time t=t3, clock signal SC1 remains "Low" and clock signal SC2 goes high. Since clock signal S2B goes low and clock signal S2 goes high, transfer gate 65 is rendered conductive, latching and outputting the signal from inverter 62 to slave latch circuit 7.

At time t=t3, since clock signal CLK is "Low", clock signal AB is "High" and clock signal A is "Low". Thus, transfer gate 55 in master latch circuit 5 is nonconductive. Transfer gate 74 in slave latch circuit 7 is conductive. Thus, the signal supplied from master latch circuit 6 to slave latch circuit 7 passes through transfer gate 74 and then is inverted by inverter 71. The inverted signal from inverter 71 is outputted as logic output signal Q from the logic output terminal.

At time t=t4, clock signal SC1 remains "Low" and clock signal SC2 goes low. Since clock signal S2B goes high and clock signal S2 goes low, transfer gate 73 is rendered conductive. Because transfer gate 74 is conductive at this time, logic output signal Q is latched and outputted.

Since control signal SMC is "High", a signal outputted from NAND gate 75 by NANDing control signal SMC and the inverted signal outputted from inverter 72 is the same as logic output signal Q outputted from the logic output terminal. Therefore, the signal that is the same as logic output signal Q is outputted as scan logic output signal SOUT from the scan logic output terminal.

In the normal mode of operation, as described above, when control signal SMC goes low, the output signal from NAND gate 75 in slave latch circuit 7, i.e., the output signal from the scan logic output terminal, is fixed to a "High" level that is equal to a power supply potential.

Therefore, in the normal mode of operation, no leakage current flows to the scan logic output terminal, and hence no operation whatsoever is performed by the scan logic output terminal, so that the amount of electric power consumed by the scan logic output terminal can be reduced.

In the scan test, at a positive-going edge of control signal SC1, scan logic input signal SIN is supplied from the scan logic input terminal to master latch circuit 6, and, at a negative-going edge of clock signal SC1, the signal supplied to master latch circuit 6 is latched and outputted to slave latch circuit 7. Subsequently, at a positive-going edge of clock signal SC2, the signal latched and outputted from master latch circuit 6 is supplied to slave latch circuit 7, and at a negative-going edge of clock circuit SC2, the signal supplied to slave latch circuit 7 is latched and outputted as scan logic output signal SOUT from the scan logic output terminal.

In the scan test, therefore, scan logic input signal SIN can be transmitted from the scan logic input terminal to the scan logic output terminal in timed relation to the positive- and negative-going edges of clock signals SC1, SC2 for thereby performing the scan test mode of operation.

In the first and second embodiments, the output signal from the scan logic output terminal is fixed to the power supply potential in the normal mode operation. However, in the present invention, the output signal from the scan logic output terminal is fixed to a ground potential in the normal mode operation.

If the output signal from the scan logic output terminal is fixed to the ground potential, then the scan flip-flop circuit shown in FIG. 3 is modified by replacing NAND gate 34 with a NOR gate, and a "High" level signal is applied to the NOR gate in the normal mode of operation and a "Low" level signal is applied to the NOR gate in the scan test, and the scan flip-flop circuit shown in FIG. 5 is modified by replacing NAND gate 75 with a NOR gate, and a "High" level signal is applied to the NOR gate in the normal mode of operation and a "Low" level signal is applied to the NOR gate in the scan test.

With such an arrangement, a signal which is the same as logic output signal Q outputted from the logic output terminal is outputted from the scan logic output terminal in the scan test, and the scan logic output terminal is fixed to the ground potential in the normal mode of operation.

While preferred embodiments of the present invention have been described using specific terms, such description is for illustrative purposes only, and it is to be understood that changes and variations may be made without departing from the spirit or scope of the following claims.

What is claimed is:

1. A scan flip-flop circuit comprising:
    a selector circuit having a first input terminal for being supplied with a logic signal for a normal mode of operation and a second input terminal for being supplied with a logic signal for a scan test, for outputting the logic signal for the normal mode of operation in the normal mode of operation and outputting the logic signal for the scan test in the scan test;
    a master latch circuit for latching and outputting a signal outputted from said selector circuit; and
    a slave latch circuit having first and second output terminals for latching and outputting a signal outputted from said master latch circuit, for latching the signal outputted from said master latch circuit and outputting the latched signal from said first output terminal, and fixing an output signal outputted from second output terminal to a power supply potential in the normal mode of operation, and latching the signal outputted from said master latch circuit and outputting the latched signal from said first and second output terminals in the scan test.

2. A scan flip-flop circuit according to claim 1, wherein said slave latch circuit outputs identical output signals from said first and second output terminals in the scan test.

3. A scan flip-flop circuit according to claim 2, wherein said slave latch circuit has a gate for being supplied with a signal which is an inversion of the signal outputted from said first output terminal and a control signal, generating a signal based on the supplied signals, and outputting the generated signal from said second output terminal.

4. A scan flip-flop circuit according to claim 3, wherein said gate comprises a NAND gate-for being supplied with a ground potential as said control signal in the normal mode of operation and with the power supply potential as said control signal in the scan test.

5. A scan flip-flop circuit comprising:
    a selector circuit having a first input terminal for being supplied with a logic signal for a normal mode of operation and a second input terminal for being supplied with a logic signal for a scan test, for outputting the logic signal for the normal mode of operation in the normal mode of operation and outputting the logic signal for the scan test in the scan test;
    a master latch circuit for latching and outputting a signal outputted from said selector circuit; and
    a slave latch circuit having first and second output terminals for latching and outputting a signal outputted from said master latch circuit, for latching the signal outputted from said master latch circuit and outputting the latched signal from said first output terminal, and fixing an output signal outputted from second output terminal to a ground potential in the normal mode of operation, and latching the signal outputted from said master latch circuit and outputting the latched signal from said first and second output terminals in the scan test.

6. A scan flip-flop circuit according to claim 5, wherein said slave latch circuit outputs identical output signals from said first and second output terminals in the scan test.

7. A scan flip-flop circuit according to claim 6, wherein said slave latch circuit has a gate for being supplied with a signal which is an inversion of the signal outputted from said first output terminal and a control signal, generating a signal based on the supplied signals, and outputting the generated signal from said second output terminal.

8. A scan flip-flop circuit according to claim 7, wherein said gate comprises a NOR gate for being supplied with a power supply potential as said control signal in the normal mode of operation and with the ground potential as said control signal in the scan test.

9. A scan flip-flop circuit comprising:
    a first master latch circuit having an input terminal for being supplied with a logic signal for a normal mode of operation, for latching and outputting the logic signal for the normal mode of operation in the normal mode- of operation;

a second master latch circuit having an input terminal for being supplied with a logic signal for a scan test, for latching and outputting the logic signal for the scan test in the scan test; and a slave latch circuit having first and second output terminals for latching and outputting signals outputted from said first and second master latch circuits, for latching the signal outputted from said first master latch circuit and outputting the latched signal from said first output terminal, and fixing an output signal outputted from second output terminal to a power supply potential in the normal mode of operation, and latching the signal outputted from said second master latch circuit and outputting the latched signal from said first and second output terminals in the scan test.

10. A scan flip-flop circuit according to claim 9, wherein said slave latch circuit outputs identical output signals from said first and second output terminals in the scan test.

11. A scan flip-flop circuit according to claim 10, wherein said slave latch circuit has a gate for being supplied with a signal which is an inversion of the signal outputted from said first output terminal and a control signal, generating a signal based on the supplied signals, and outputting the generated signal from said second output terminal.

12. A scan flip-flop circuit according to claim 11, wherein said gate comprises a NAND gate for being supplied with a ground potential as said control signal in the normal mode of operation and with the power supply potential as said control signal in the scan test.

13. A scan flip-flop circuit comprising:

a first master latch circuit having an input terminal for being supplied with a logic signal for a normal mode of operation, for latching and outputting the logic signal for the normal mode of operation in the normal mode of operation;

a second master latch circuit having an input terminal for being supplied with a logic signal for a scan test, for latching and outputting the logic signal for the scan test in the scan test; and a slave latch circuit having first and second output terminals for latching and outputting signals outputted from said first and second master latch circuits, for latching the signal outputted from said first master latch circuit and outputting the latched signal from said first output terminal, and fixing an output, signal outputted from second output terminal to a ground potential in the normal mode of operation, and latching the signal outputted from said second master latch circuit and outputting the latched signal from said first and second output terminals in the scan test.

14. A scan flip-flop circuit according to claim 13, wherein said slave latch circuit outputs identical output signals from said first and-second output terminals in the scan test.

15. A scan flip-flop circuit according to claim 14, wherein said slave latch circuit has a gate for being supplied with a signal which is an inversion of the signal outputted from said first output terminal and a control signal, generating a signal based on the supplied signals, and outputting the generated signal from said second output terminal.

16. A scan flip-flop circuit according to claim 15, wherein said gate comprises a NOR gate for being supplied with a power supply potential as said control signal in the normal mode of operation and with the ground potential as said control signal in the scan test.

* * * * *